United States Patent
Barabi et al.

(10) Patent No.: US 10,481,175 B2
(45) Date of Patent: *Nov. 19, 2019

(54) CONTACTOR WITH ANGLED DEPRESSIBLE PROBES

(71) Applicant: Essai, Inc., Fremont, CA (US)

(72) Inventors: Nasser Barabi, Lafayette, CA (US); Oksana Kryachek, San Francisco, CA (US); Chee-Wah Ho, Fremont, CA (US)

(73) Assignee: ESSAI, INC., Fremont, CA (US)

( * ) Notice: Subject to any disclaimer, the term of this patent is extended or adjusted under 35 U.S.C. 154(b) by 35 days.

This patent is subject to a terminal disclaimer.

(21) Appl. No.: 15/707,958

(22) Filed: Sep. 18, 2017

(65) Prior Publication Data

US 2018/0172730 A1 Jun. 21, 2018

Related U.S. Application Data

(63) Continuation of application No. 12/005,139, filed on Dec. 21, 2007, now Pat. No. 9,766,268.

(60) Provisional application No. 60/876,909, filed on Dec. 21, 2006.

(51) Int. Cl.
*G01R 1/04* (2006.01)

(52) U.S. Cl.
CPC .......... *G01R 1/0483* (2013.01); *G01R 1/0466* (2013.01)

(58) Field of Classification Search
None
See application file for complete search history.

(56) References Cited

U.S. PATENT DOCUMENTS

| | | |
|---|---|---|
| 5,092,774 A | 3/1992 | Milan |
| 5,451,883 A | 9/1995 | Staab |
| 5,945,836 A | 8/1999 | Sayre et al. |
| 6,046,597 A | 4/2000 | Barabi |
| 6,208,155 B1 | 3/2001 | Barabi et al. |
| 6,220,870 B1 | 4/2001 | Barabi et al. |
| 6,354,859 B1 | 3/2002 | Barabi et al. |
| 6,407,565 B1 | 6/2002 | Sayre et al. |
| 6,441,632 B1 | 8/2002 | Correia et al. |
| 6,980,013 B2 | 12/2005 | Machida et al. |
| 7,268,568 B2 | 9/2007 | Machida et al. |
| 9,766,268 B2 * | 9/2017 | Barabi ................ G01R 1/0483 |
| 2003/0234656 A1 | 12/2003 | Willard |
| 2007/0052432 A1 | 3/2007 | Machida et al. |

* cited by examiner

*Primary Examiner* — Jermele M Hollington
(74) *Attorney, Agent, or Firm* — Kang S. Lim

(57) ABSTRACT

A spring probe contactor includes an angled spring probe configuration that causes the tips of the spring probes to "swipe" the contact pads/solder balls of an IC device under test as the contacts are made. The angulation of the spring probes permit penetration through foreign material layers on the pad/ball surfaces with less contact force.

22 Claims, 5 Drawing Sheets

CONTACTOR WITH ANGLED DEPRESSIBLE PROBES

CROSS-REFERENCE TO RELATED APPLICATIONS

This application claims the benefit and is a continuation of U.S. application Ser. No. 12/005,139, filed on Dec. 21, 2007, recently allowed, which in turn claims the benefit of U.S. Provisional Application No. 60/876,909, filed Dec. 21, 2006, which applications are incorporated herein in their entirety by this reference.

BACKGROUND OF THE INVENTION

The present invention generally relates to test contactors used to establish an electrical interface between an integrated circuit (IC) device under test, and a circuit board, and more particularly, relates to the need to obtain a clean and dependable electrical contact between the spring probes of a contactor and the device under test (DUT).

The dependability of the electrical connection between the spring probes of the contactor and the contact pads or solder balls of a DUT package can be affected by the ability of the spring probes to penetrate through foreign material layers on the DUT's contact pads/solder balls (sometimes referred to herein as simply "contact pads"). Heretofore, spring probe contactors have been designed such that the spring probes contact the DUT's contact pads perpendicularly, that is, at a 90 degree angle relative to the DUT package, referred to herein as the z-axis. With the rapidly increasing pad/ball densities of IC devices, contact resistance requirements for testing devices are being rapidly reduced. With such reduction, the ability to achieve a good and dependable contact with the pads/balls of the DUT package has become a difficult problem, due the difficulty of penetrating the foreign material layers on the contact/ball surfaces. Resulting decrease in reliability in the contacts have led to costly retesting, and to the unnecessary rejection of tested IC devices.

The present invention overcomes the limitations of conventional contact designs by providing for an improved contactor capable of achieving good and dependable electrical contacts with the pads/solder balls of an IC package with a minimum contact force.

SUMMARY OF THE INVENTION

Briefly, the invention is directed to a spring probe contactor capable of achieving good and dependable electrical contacts with the contact pads and solder balls of an IC device with spring forces that are relatively low as compared to the spring probes of conventional contactors. A contactor provides for a spring probe configuration that causes the tips of the spring probes to "swipe" the contact pads/solder balls as the contacts are made, to permit penetration through foreign material layers on the pad/ball surfaces with less contact force.

The foregoing advantages are achieved by providing a contactor comprised of a contactor body having a top face and a bottom face substantially parallel to said top face, wherein the top and bottom faces of the body portion define contactor interface wall lying in an x-y plane, and wherein the z-axis defines the perpendicular to the interface wall. A plurality of spring probes (pogo-pins) provided in the interface wall have probe tips that extend beyond the faces of the contactor. The spring probes arranged in the interface wall of the contactor body at an angle relative to the contactor's z-axis, such that one end of the probe tips emerge at an angle from the top face of the interface wall. The spring probes are configured in an angled array or arrays that cause the probe tips at the top face of the interface wall to match the configuration of contact pads/solder balls of a device under test when the DUT is placed against the top face of the contactor interface wall. Because the probe tips of the spring probes emerge from the top face of the contactor at an angle, they will swipe across the contact pad/ball surfaces as the probe tips are depressed by the DUT. The swiping action will allow the probe tips of the spring probe array to more easily penetrate foreign material on the pad/ball surfaces for achieving a reliable contact with a lower spring force. This, in turn, will allow spring probes with lower spring forces to be used, which would be particularly advantageous in high-density IC chip packages.

It is noted that the angled spring probes provide yet another advantage, in that, they tend to force the probe tips against the conductive walls of the probe barrels, thereby improving the overall conductivity of the probes.

The spring probes of the angled springs array or arrays can be either single-ended (one probe tip is not depressible) or double-ended spring probes (both probe tips are depressible). For single-ended spring probes, it is contemplated that the probe tips emerging from the top face of the interface wall of the contactor can be fixed (non-depressible) with the depressible spring-loaded probe tip emerging from the bottom face of the interface wall for contacting the test board. However, is would be possible to reverse the spring-loaded probe tips of the single-ended probes.

In an alternative aspect of the invention, two spring probe arrays are provided, wherein each of the arrays is oriented at a different angle relative to the other spring probe array. Such the arrays are configured in the contactor interface wall such that the probe tips of the two arrays emerge from the top face of the contactor at different angles. Providing spring probe arrays with a different angle orientations increases flexibility in matching different DUT pad or solder ball patterns. It also tends to balance the lateral exerted on the DUT by the angled probes tips.

The desired angulation of the spring probe tips will generally depend on the application. It is contemplated the suitable angles will range from 2 to 25 degrees from the z-axis.

Note that the various features of the present invention described above may be practiced alone or in combination. These and other features of the present invention will be described in more detail below in the detailed description of the invention and in conjunction with the following figures.

DESCRIPTION OF THE DRAWINGS

In order that the present invention may be more clearly ascertained, some embodiments will now be described, by way of example, with reference to the accompanying drawings, in which.

DESCRIPTION OF THE ILLUSTRATED EMBODIMENT

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "consist", "will," "will not," "shall," "shall not," "must," "must not," "only," "first," "initially," "next," "subsequently," "before," "after," "lastly," and "finally," are not meant to limit the scope of the present invention as the embodiments disclosed herein are merely exemplary.

Figure 1:
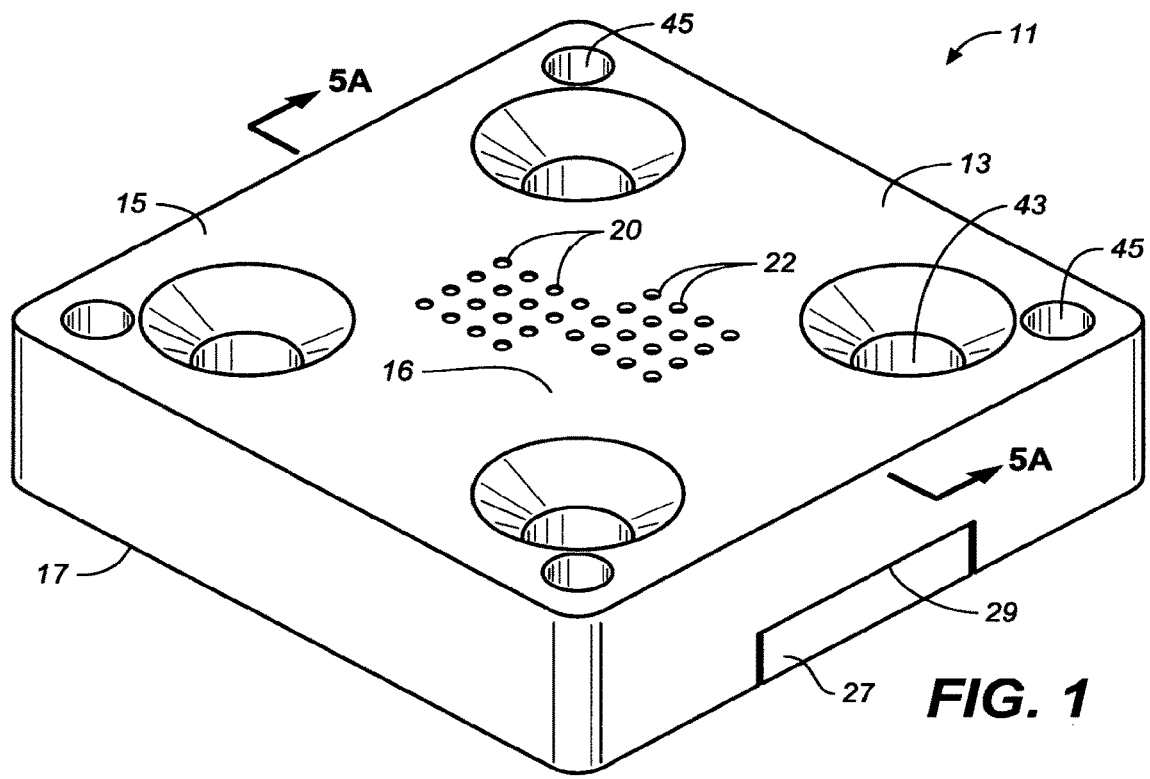
FIG. 1 is top perspective view of a spring probe contactor in accordance with the invention.
Figure 2:
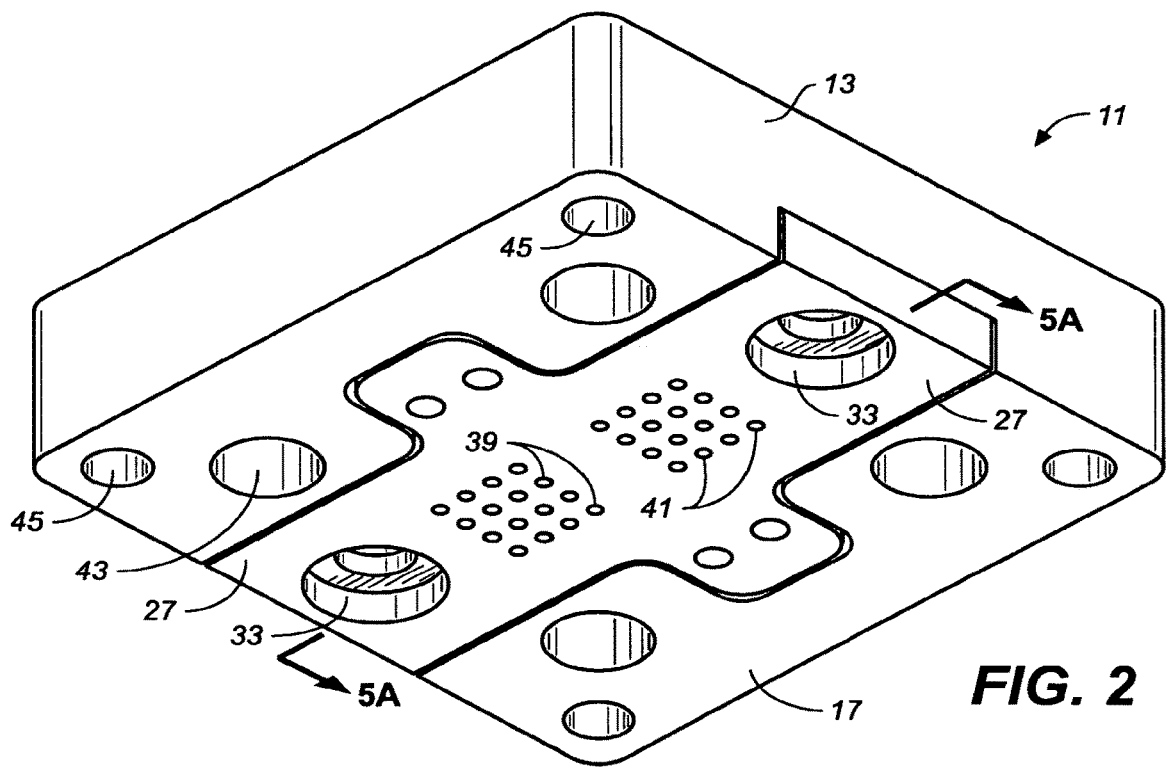
FIG. 2 is a bottom perspective view thereof.
Figure 3:
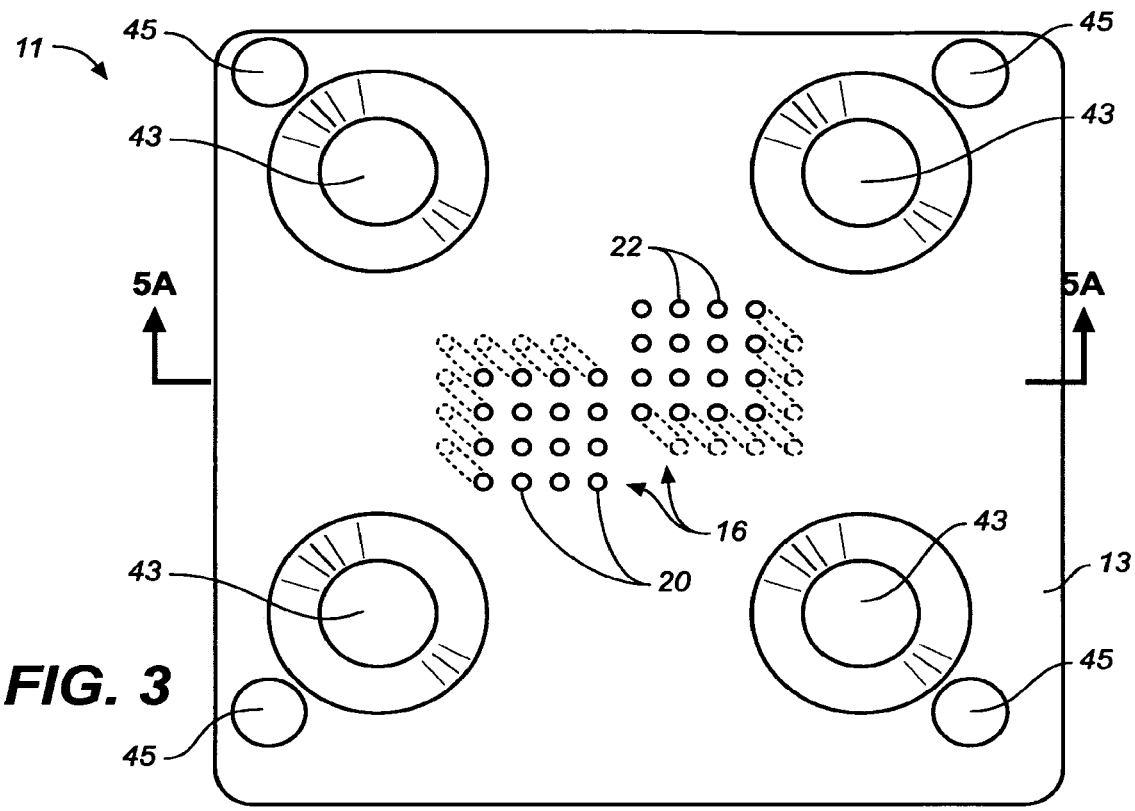
FIG. 3 is a top plan view thereof.
Figure 4:
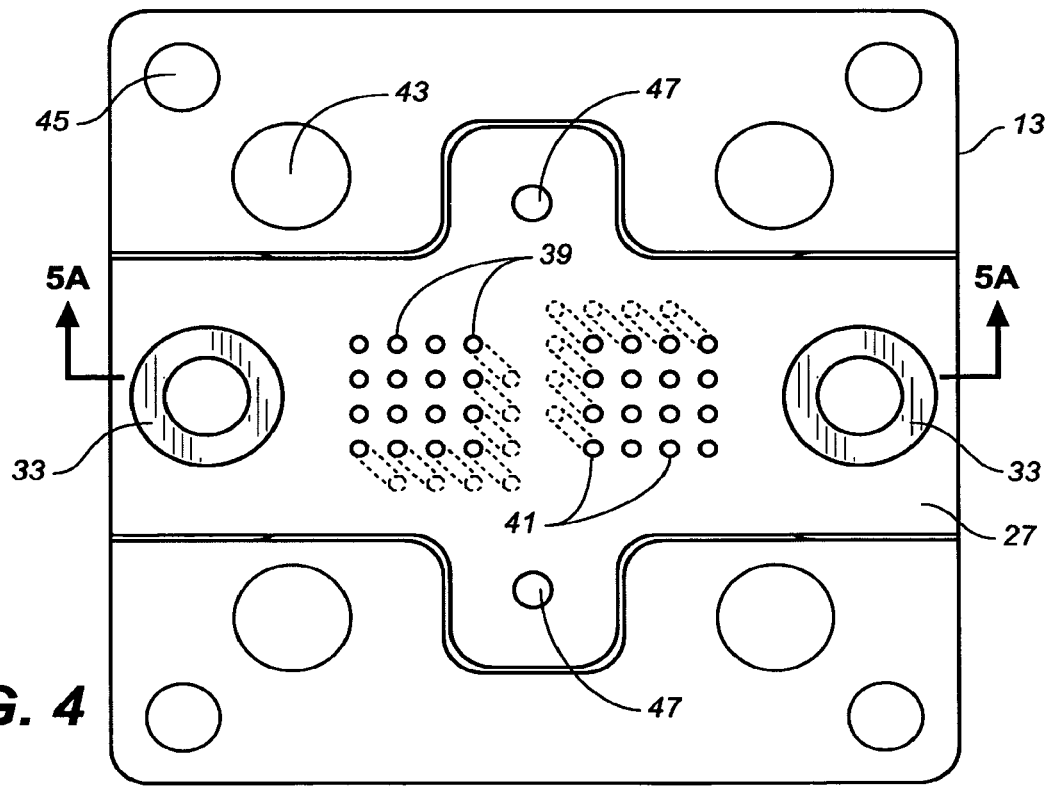
FIG. 4 is a bottom plan view thereof.
Figure 5A:
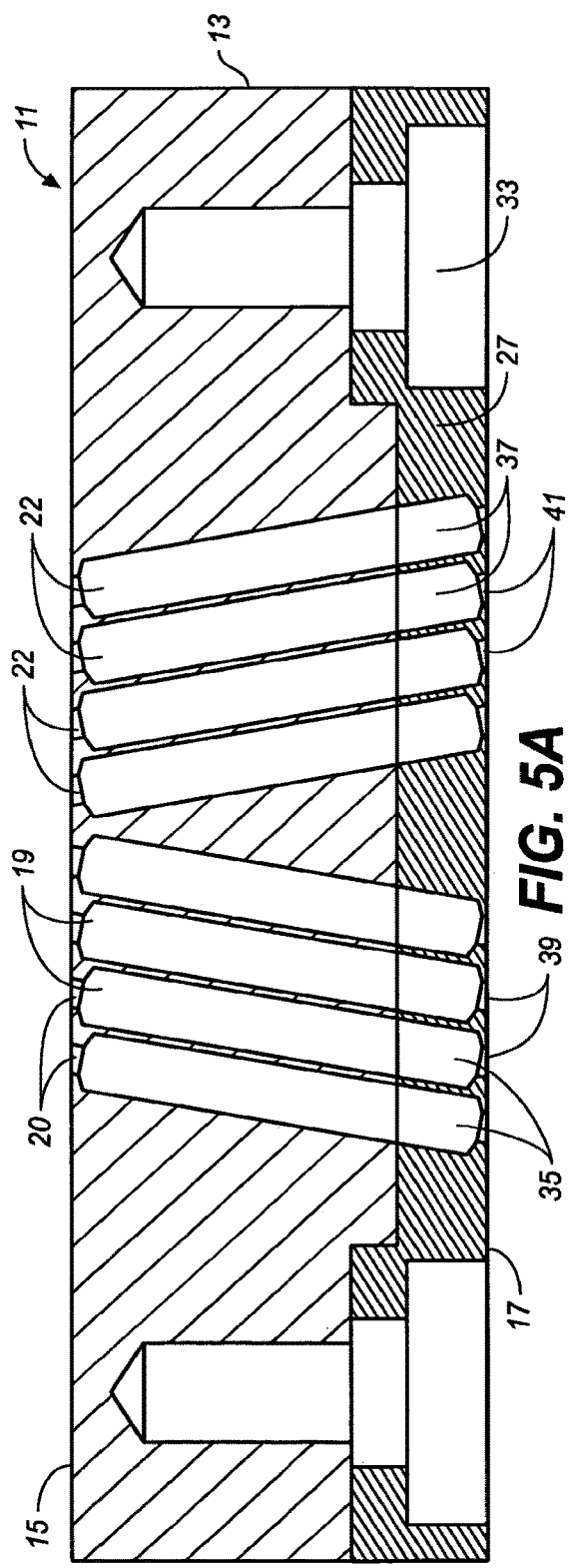
FIG. 5A is an enlarged cross-sectional view thereof, taken along lines 5A-5A in the foregoing figures, without the spring probes.

Referring to the drawings, spring probe contactor 11 includes a body portion 13 having parallel top and bottom faces 15, 17 defining contactor interface wall 16. As best illustrated in FIG. 5A, two sets of angled spring probe retention cavities 19, 21 extend through the interface wall 16 and terminate at the contactor's top face 13 in two arrays of small diameter spring pin openings 20 and 22. The arrays of spring pin openings 20, 22 are designed to match the footprint of the contact pads/solder balls for particular IC devices for which the contactor will be used.

Figure 5B:
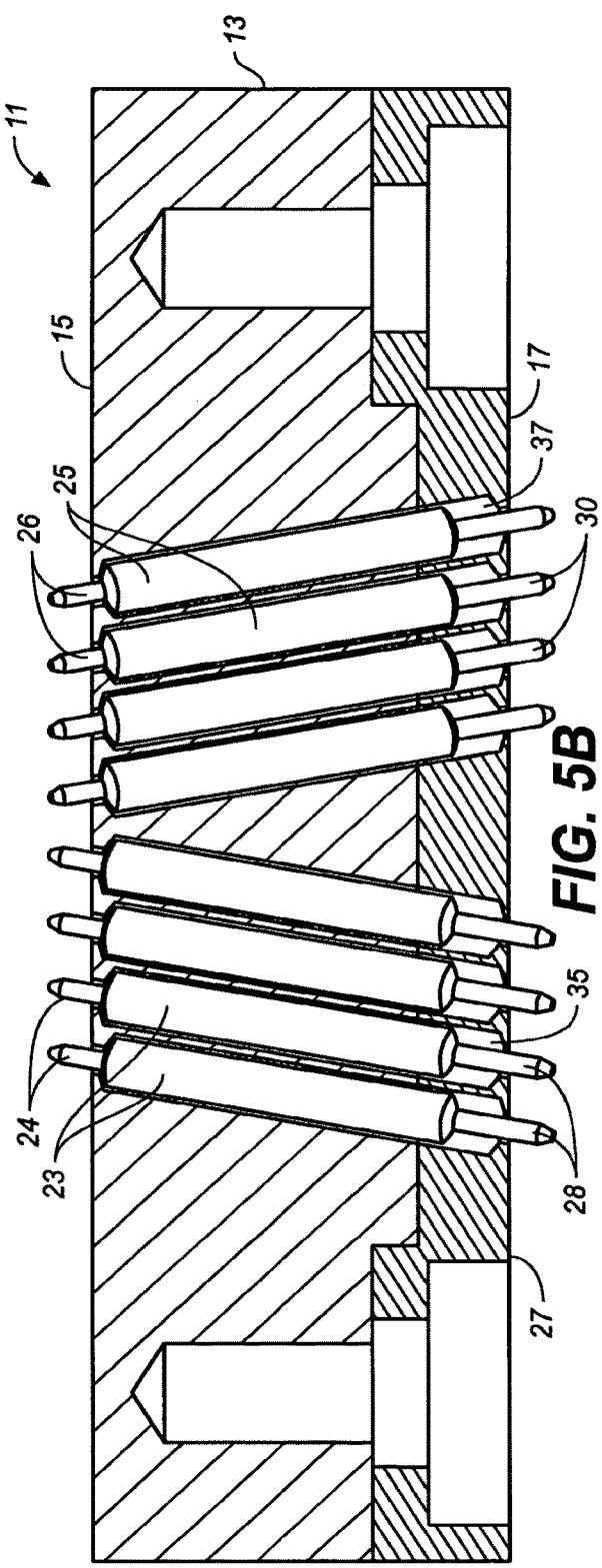
FIG. 5B is the cross-sectional view shown in FIG. 5A with the spring probes loaded into the spring probe cavities of the contactor body.

As illustrated in FIG. 5B, two sets of single-ended spring probes 23, 25 having non-depressible probe tips 24, 26 and depressible spring-loaded probe tips 28, 30 are loaded into the angled spring probe retention cavities 19, 21 from the bottom face side of the contactor. As seen in FIG. 5B, when the spring probes 23, 25 are fully inserted into the retention cavities 19, 21, their probe tips 24, 26 extend through and emerge from the array of openings 20, 24 on the contactor's top face. Due to the angulation of the spring probes, these probe tips project beyond the top face of the contactor at an angle, which is different for each set of spring probes.

Preferably, the angles of projection for the first set of spring tips 24 in reference to the z axis of the contactor will be equal and opposite to the angle of the set of spring tips 26 about the z axis. By providing a separate array of spring probes having an equal number of probes in each array, and angled in opposing directions, the lateral forces exerted on the IC chip by the probe tips will be substantially balanced in the x-y plane.

The spring probe arrays 23, 25 are held into the contactor body by means of a retainer plate 27. A recess 29 is provided in the bottom face of the contactor body for receiving this retainer plate. The retainer plate can be held to the contactor body by means of suitable retaining screws inserted through counter-sunk screw openings 33 in the retainer plate and threaded into screw holes 31 in the contactor body.

It can be seen that the two sets of spring probe cavities 35, 37 are provided in the central area of the retainer plate to accommodate the back end of the spring probes at the bottom face of the contactor. Each of the cavities 35, 37 will be long enough to allow the spring probe barrels to move downwardly when the DUT is pressed against the probe tips at the top face of the contactor interface wall. Cavities 35, 37 are seen to terminate in a small pin opening 39, 41, through which the depressible spring probe tips 28, 30 can extend for contacting the electrical contact points of a test board.

The angulation of the spring probes in the contactor body relative to the z axis will depend on the particular application. The length of the swipe of the spring tips 24, 26 of the spring probes across the contact pads/solder balls of an IC device can be designed by the choice of the spring probe angulation and the length of the depressible spring tips 24, 26. Generally, it is contemplated that the angulation relative to the z axis will be in a range of 2 to 25 degrees, with a preferred angulation in the range of 10 to 20 degrees.

The contactor is suitably held to a test board by means of mounting screws inserted through mounting holes 43 in the corners of the contactor body. The contactor body is further suitably provided with alignment pin holes 45 for achieving a precise alignment of the contactor on the test board. Suitable alignment means can also be provided between the contactor body and retaining plate 27, such as providing a key structure or alignment pin holes in the contactor body and retaining plate (such as using alignment pins in alignment holes 47 in the retaining plate).

Figure 6:
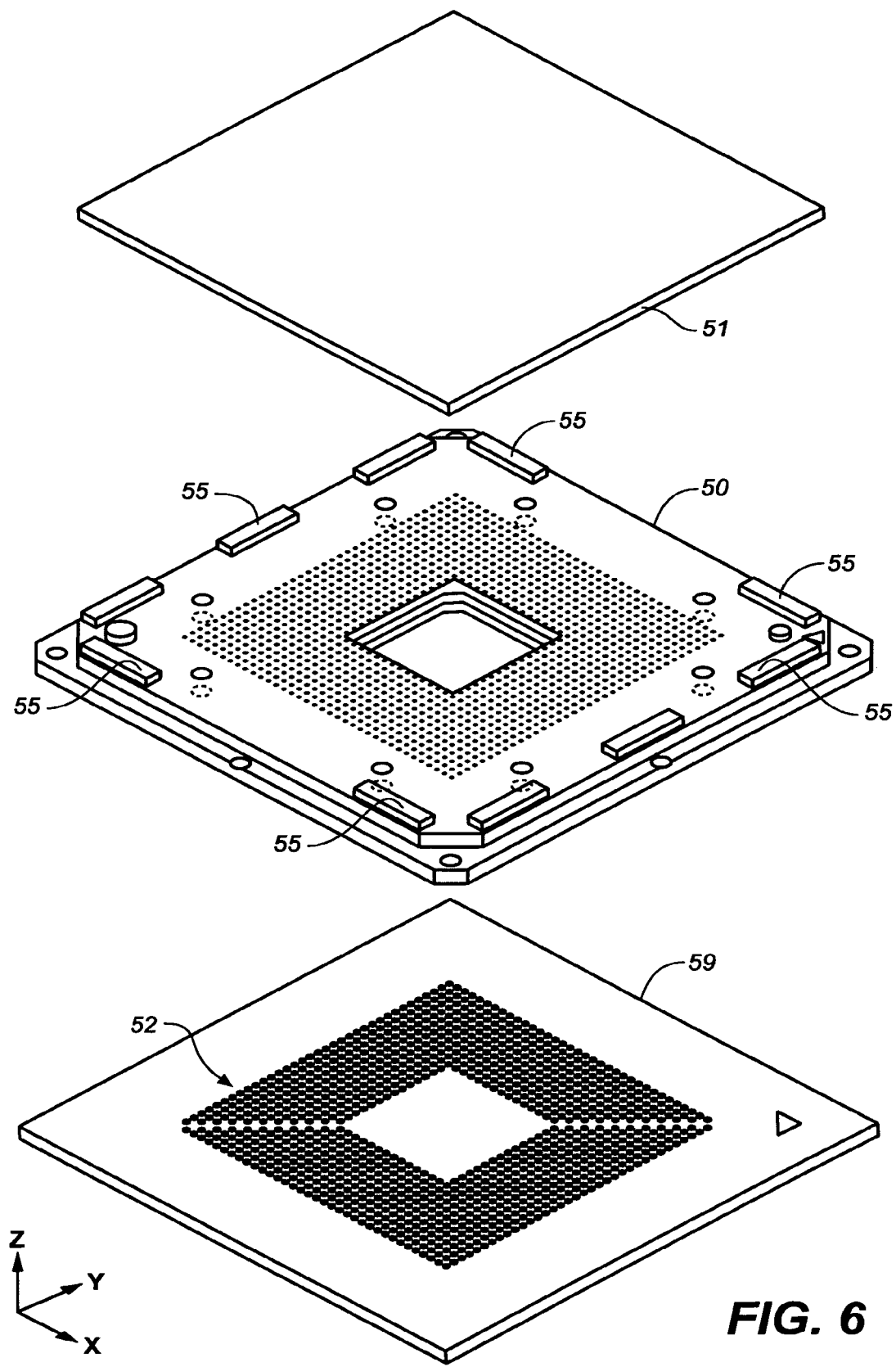
FIG. 6 is an exploded view of a contactor, IC device, and test board illustrating the use of the contactor.
Figure 7:
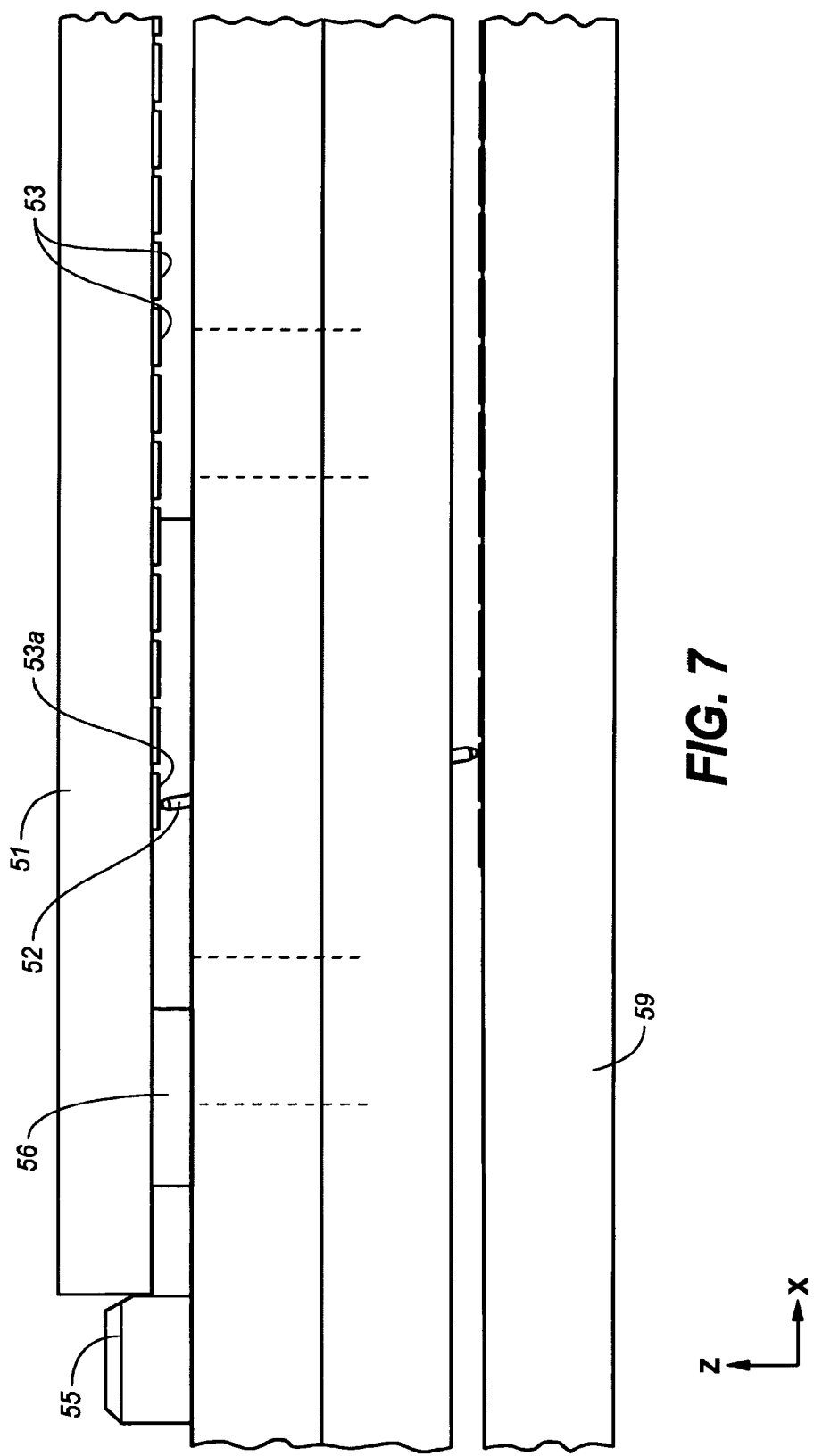
FIG. 7 is an enlarged cut-away view of the spring probe contactor, IC device under test, and test board shown in FIG. 6, with the DUT pressed against the contactor, and illustrating how the angled spring probes contact the contact pads of the DUT.

FIGS. 6 and 7 illustrate a practical implementation of a contactor using angled spring probes in accordance with the invention. In FIGS. 6 and 7, the IC device under test (DUT), denoted by the numeral 51, and the test board, denoted by the numeral 59, are shown. For ease of illustration, only one spring probe of the two arrays of spring probes is illustrated in FIG. 7. The spring probes can be single-ended as described above in connection with the illustrative embodiment shown in FIGS. 1-5.

As generally shown in FIGS. 6 and 7, the DUT 51, which has contact pads 53, is dropped in the z axis down onto contactor 50 such that the probe tips 52 of the spring probes are pressed downwardly by the chip's contact pads, such as pad 53a. (The DUT is suitably pressed onto the contactor by a suitable lid and depressor mechanism not shown, but known in the art.) The chip is guided to the contactor by guide rails 55, and moves in the z-axis direction to a seating position against seating posts 56. As the chip is moved to the seating position, the angled probe tips 52 contact the DUT's contact pads 53 before the DUT reaches its seating position. As the DUT continues to toward its seating position, the probe tip moves in the x-y plane across the contact pads 53, thereby creating a swiping action.

The spring probes of the application shown in FIGS. 6 and 7 are suitably angled in the same direction. A retaining plate for the probes (not shown) is suitably provided on the bottom of the contactor body.

While this invention has been described in terms of several embodiments, there are alterations, modifications, permutations, and substitute equivalents, which fall within the scope of this invention. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A contactor for providing electrical contact between an array of contacts of an IC device under test (DUT) and a test board, said contactor comprising:
   a body portion having substantially parallel top and bottom faces defining a contactor interface wall which lies in an x-y plane and which has a perpendicular z-axis, the top face of said contactor interface wall receiving a DUT which is placed contacts down on said top face, and
   a plurality of depressible probes extending through said contactor interface wall, said depressible probes having probe tips and being angled relative to the z-axis of said interface wall such that the probe tips of said depressible probes emerge at an angle from the top and bottom faces thereof, and wherein the depressible probes are arranged in different arrays of depressible probes, the depressible probes of one array of depressible probes being angled oppositely from the depressible probes of another array of depressible probes, and wherein the oppositely angled arrays of depressible probes exert equally opposing forces in the x-y plane on the DUT thereby self-aligning and self-centering the DUT with respect to the body portion.

2. The contactor of claim 1 wherein the angle of the depressible probes relative to the z-axis of said contactor interface wall is between about 2 and 25 degrees.

3. The contactor of claim 1 wherein the angle of the depressible probes relative to the z-axis of said contactor interface wall is between about 10 and 20 degrees.

4. The contactor of claim 1 wherein at least two arrays of depressible probes are provided, one of which is angled oppositely from the depressible probes of other array of depressible probes.

5. The contactor of claim 1 wherein said depressible probes are single-ended depressible probes having depressible probe tips and a non-depressible probe tips.

6. The contactor of claim 5 wherein the non-depressible probe tips of said single-ended depressible probes emerges from the top face of said contactor interface wall to contact the contacts of a DUT placed on the contactor.

7. The contactor of claim 1 wherein said depressible probes are double-ended depressible probes.

8. The contactor of claim 1 wherein the oppositely angled arrays of depressible probes are numerically equal.

9. A contactor for providing electrical contact between an array of contacts of an IC device under test (DUT) and a test board, said contactor comprising:
   a body portion having substantially parallel top and bottom faces defining a contactor interface wall lying in an x-y plane and having a perpendicular z-axis, said body portion having a plurality of probe retention cavities angled relative to the z-axis of said interface wall, and
   a plurality of depressible probes in the angled probe retention cavities of said contactor interface wall, each of said depressible probes having a probe barrel which is contained within its probe retention cavity and oppositely extending probe tips which extend through the top and bottom faces of said interface wall at an angle relative to said z-axis, at least one of the angled probe tips of each of said depressible probes being depressible in the probe barrel, and wherein the probe retention cavities in said contactor interface wall are arranged in different arrays, one array of probe retention cavities being angled oppositely from another array of probe retention cavities, and wherein the oppositely angled arrays of depressible probes exert equally opposing forces in the x-y plane on the DUT thereby self-aligning and self-centering the DUT with respect to the body portion.

10. The contactor of claim 9 wherein the angle of the probe retention cavities in said contactor interface wall relative to the z-axis is between about 2 and 25 degrees.

11. The contactor of claim 9 wherein the angle of the probe retention cavities in said contactor interface wall relative to the z-axis is between about 10 and 20 degrees.

12. The contactor of claim 9 wherein said interface wall has a retainer plate recessed into one of the faces thereof and wherein said depressible probes are held in the probe retention cavities of said interface wall by said retainer plate.

13. The contactor of claim 9 wherein said probe retention cavities are sized relative to the probe barrels of said depressible probes to allow the probe barrels to move in said retention cavities.

14. A contactor for providing electrical contact between an array of contacts of an IC device under test (DUT) and a test board, said contactor comprising:
   a body portion for receiving a DUT, and
   a plurality of depressible probes extending through said body portion for providing electrical contact between the array of contacts of a DUT placed in the contactor and the test board to which the contactor is mounted, said depressible probes having probe tips that emerge from the body portion of the contactor at an angle so as to contact and swipe across the contacts of the DUT as the DUT is pressed against said depressible probes, and wherein the depressible probes are arranged in different arrays of depressible probes, the depressible probes of one array of depressible probes being angled oppositely from the depressible probes of another array of depressible spring probes, and wherein the oppositely angled arrays of depressible probes exert equally opposing forces in the x-y plane on the DUT thereby self-aligning and self-centering the DUT with respect to the body portion.

15. The contactor of claim 14 wherein said body portion has a z-axis along which the DUT is moved when pressing the DUT against the probe tips of the contactor's depressible probes and wherein said probe tips emerge from said body portion at an angle of between about 2 and 25 degrees relative to said z-axis.

16. The contactor of claim 14 wherein said body portion has a z-axis along which the DUT is moved when pressing the DUT against the probe tips of the contactor's depressible probes and wherein said probe tips emerge from said body portion at an angle of between about 10 and 20 degrees relative to said z-axis.

17. The contactor of claim 14 wherein said depressible probes are single-ended depressible probes having depressible probe tips and a non-depressible probe tips.

18. The contactor of claim 17 wherein said single-ended depressible probes are arrange in said body portion such that the non-depressible probe tips contact a DUT placed on the contactor.

19. The contactor of claim 14 wherein said depressible probes are double-ended depressible probes.

20. A method of providing electrical contact between an array of contacts of an IC device under test (DUT) and a test board, comprising:
   mounting a contactor having an array of depressible probes to a test board wherein the probe tips of the contactor depressible probes emerge from an interface wall of the contactor at an angle relative to the perpendicular z-axis of said interface wall, and wherein the depressible probes are arranged in different arrays of depressible probes, the depressible probes of one array of depressible probes being angled oppositely from the depressible probes of another array of depressible probes, and wherein the oppositely angled arrays of depressible probes exert equally opposing forces in the x-y plane on the DUT thereby self-aligning and self-centering the DUT with respect to the body portion,
   selecting a DUT having an array of contacts that correspond to the array of depressible probes of the contactor,
   pressing the DUT into the contactor against the contactor interface wall in the direction of the z-axis of the interface wall such that the array of contacts on the DUT are pressed against the angled depressible probes of the contractor, and
   removing the DUT from the contactor after test.

21. The contactor of claim 20 wherein the DUT is pressed against the probe tips of depressible probes that emerge from the interface wall of the DUT at an angle of between about 2 and 25 degrees relative to said z-axis.

22. The contactor of claim 20 wherein the DUT is pressed against the probe tips of depressible probes that emerge from the interface wall of the DUT at an angle of between about 10 and 20 degrees relative to said z-axis.

\* \* \* \* \*